(12) United States Patent
Sanguinetti et al.

(10) Patent No.: US 10,705,430 B2
(45) Date of Patent: Jul. 7, 2020

(54) METHOD OF MEASURING A PARAMETER OF INTEREST, INSPECTION APPARATUS, LITHOGRAPHIC SYSTEM AND DEVICE MANUFACTURING METHOD

(71) Applicant: ASML NETHERLANDS B.V., Veldhoven (NL)

(72) Inventors: Gonzalo Roberto Sanguinetti, Eindhoven (NL); Nicolas Mauricio Weiss, Hilversum (NL); Jean-Pierre Agnes Henricus Marie Vaessen, Echt (NL)

(73) Assignee: ASML Netherlands B.V., Veldhoven (NL)

( * ) Notice: Subject to any disclaimer, the term of this patent is extended or adjusted under 35 U.S.C. 154(b) by 41 days.

(21) Appl. No.: 15/977,866

(22) Filed: May 11, 2018

(65) Prior Publication Data
US 2018/0341182 A1 Nov. 29, 2018

Related U.S. Application Data

(60) Provisional application No. 62/510,730, filed on May 24, 2017.

(51) Int. Cl.
  *G03F 7/20* (2006.01)
(52) U.S. Cl.
  CPC .......... *G03F 7/70133* (2013.01); *G03F 7/705* (2013.01); *G03F 7/70516* (2013.01);
  (Continued)

(58) Field of Classification Search
  CPC ........ G01B 11/26; G01B 11/272; G01B 5/24; G03F 7/70633; G03F 1/42; G03F 1/84;
  (Continued)

(56) References Cited

U.S. PATENT DOCUMENTS

| | | | |
|---|---|---|---|
| 7,362,435 B1 | 4/2008 | Johs et al. | |
| 7,791,727 B2 | 9/2010 | Den Boef et al. | |

(Continued)

FOREIGN PATENT DOCUMENTS

| | | |
|---|---|---|
| WO | 2013/178422 | 12/2013 |
| WO | 2016-162228 | 10/2016 |
| WO | 2016-162231 | 10/2016 |

OTHER PUBLICATIONS

International Search Report issued in corresponding PCT Patent Application No. PCT/EP2018/061189, dated Aug. 2, 2018.

*Primary Examiner* — Mesfin T Asfaw
(74) *Attorney, Agent, or Firm* — Pillsbury Winthrop Shaw Pittman LLP

(57) ABSTRACT

A method of measuring a parameter of interest relating to a structure formed by a process on a substrate, and associated apparatuses. The method includes measuring the structure with measurement radiation including a first illumination acquisition setting (determining one or more selected from: a wavelength, a polarization or an incident angle of the measurement radiation) to obtain a first measurement value for the structure. The method further includes estimating, by applying a correction model to the first measurement value, at least a second measurement value for the structure corresponding to measurement of the structure with a second illumination acquisition setting different from the first illumination acquisition setting.

20 Claims, 5 Drawing Sheets

(52) U.S. Cl.
CPC ...... *G03F 7/70566* (2013.01); *G03F 7/70575* (2013.01); *G03F 7/70633* (2013.01)

(58) Field of Classification Search
CPC ...... G03F 7/70683; G03F 7/20; G03F 9/7015; H01L 2223/54426
See application file for complete search history.

(56) References Cited

U.S. PATENT DOCUMENTS

| | | |
|---|---|---|
| 7,791,732 B2 | 9/2010 | Den Boef et al. |
| 8,339,595 B2 | 12/2012 | Den Boef |
| 8,411,287 B2 | 4/2013 | Smilde et al. |
| 8,705,007 B2 | 4/2014 | Cramer et al. |
| 8,786,825 B2 | 7/2014 | Van De Kerkhof et al. |
| 8,867,020 B2 | 10/2014 | Smilde et al. |
| 9,081,303 B2 | 7/2015 | Cramer et al. |
| 9,110,385 B2 | 8/2015 | Den Boef |
| 9,134,256 B2 | 9/2015 | Smilde et al. |
| 9,140,998 B2 | 9/2015 | Smilde et al. |
| 9,261,772 B2 | 2/2016 | Quintanilha |
| 2006/0033921 A1 | 2/2006 | Den Boef et al. |
| 2006/0066855 A1 | 3/2006 | Den Boef et al. |
| 2010/0201963 A1 | 8/2010 | Cramer et al. |
| 2010/0328655 A1 | 12/2010 | Den Boef |
| 2011/0027704 A1 | 2/2011 | Cramer et al. |
| 2011/0043791 A1 | 2/2011 | Smilde et al. |
| 2011/0069292 A1 | 3/2011 | Den Boef |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2012/0123748 A1 | 5/2012 | Aben et al. |
| 2012/0242970 A1 | 9/2012 | Smilde et al. |
| 2013/0258310 A1 | 10/2013 | Smilde et al. |
| 2013/0271740 A1 | 10/2013 | Quintanilha |
| 2013/0308142 A1 | 11/2013 | Straaijer |
| 2015/0046118 A1 | 2/2015 | Pandev et al. |
| 2016/0246185 A1* | 8/2016 | Ypma ............... G03F 7/70508 |
| 2018/0321597 A1 | 11/2018 | Javaheri et al. |

* cited by examiner

METHOD OF MEASURING A PARAMETER OF INTEREST, INSPECTION APPARATUS, LITHOGRAPHIC SYSTEM AND DEVICE MANUFACTURING METHOD

This application claims the benefit of priority of U.S. provisional patent application No. 62/510,730, filed May 24, 2017, which is incorporated herein in its entirety by reference.

FIELD

The present description relates to methods and apparatus for metrology usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic or other device manufacturing processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in United States patent application publication nos. US 2006-0033921 and US 2010-0201963. The targets used by such scatterometers are relatively large, e.g., 40 µm by 40 µm, periodic structure (e.g., gratings) and the measurement beam generates a spot that is smaller than the periodic structure (i.e., the periodic structure is underfilled). In addition to measurement of feature shapes by reconstruction, diffraction based overlay can be measured using such apparatus, as described in U.S. patent application publication no. US 2006-0066855. Diffraction-based overlay metrology using dark-field imaging of the diffraction orders enables measurement of overlay and other parameters on smaller targets. These targets can be smaller than the illumination spot and may be surrounded by product structures on a substrate. The intensities from the environment product structures can efficiently be separated from the intensities from the overlay target with the dark-field detection in the image-plane.

Examples of dark-field imaging metrology can be found in U.S. patent application publication nos. US 2010-0328655 and US 2011-0069292, which documents are hereby incorporated by reference in their entirety. Further developments of the technique have been described in U.S. patent application publication nos. US 2011-0027704, US 2011-0043791, US 2011-102753, US 2012-0044470, US 2012-0123581, US 2012-0242970, US 2013-0258310, US 2013-0271740 and PCT patent application publication no. WO 2013-178422, each which documents is hereby incorporated by reference in its entirety. Typically in these methods it is desired to measure asymmetry as a property of the target. Targets can be designed so that measurement of asymmetry can be used to obtain measurement of various performance parameters such as overlay, focus or dose. Asymmetry of the target is measured by detecting differences in intensity between opposite portions of the diffraction spectrum using the scatterometer. For example, the intensities of +1 and −1 diffraction orders may be compared, to obtain a measure of asymmetry.

SUMMARY

Targets respond differently to different illumination settings (e.g., different wavelengths and/or polarizations and/or angles), and may show a strong dependency of a reported magnitude depending on (for example) the wavelength used for the measurement. Therefore greater accuracy can be achieved by measuring a target with more than one illumination setting, as combining information from multiple acquisitions at different illumination settings can significantly reduce this dependency. However this can result in an undesirable throughput impact, as the measurement may need to be repeated for each measurement at a different illumination setting.

It is desirable to provide a method and apparatus for metrology, for example to measure asymmetry and/or overlay in target periodic structures, in which measurements of a target corresponding to different illumination acquisition settings may be obtained without a corresponding throughput penalty.

In an aspect, there is provided a method of measuring a parameter of interest relating to a structure formed by a process on a substrate, the method comprising: a) measuring the structure with measurement radiation comprising a first illumination acquisition setting to obtain a first measurement value for the structure corresponding to measurement of the structure with the first illumination acquisition setting, wherein the illumination acquisition setting determines one or more selected from: a wavelength, a polarization or an incident angle of the measurement radiation; and b) estimating, by applying a correction model to the first measurement value, at least a second measurement value for the structure corresponding to measurement of the structure with a second illumination acquisition setting different from the first illumination acquisition setting.

In an aspect, there is provided a computer program product comprising machine readable instructions for causing a programmable processing device to implement a method as described herein. The machine readable instructions may be embodied for example in a non-transitory storage medium.

In an aspect, there is provided a lithographic system including a lithographic apparatus and an inspection apparatus comprises the computer program product as described herein or configured to perform a method as described herein.

In an aspect, there is provided a method of manufacturing devices wherein a device pattern is applied to a series of substrates using a lithographic process, the method including measuring asymmetry of at least one periodic structure formed as part of or beside the device pattern on at least one of the substrates using a method as described herein, and controlling the lithographic process for later substrates based on the result of the asymmetry measurement.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

Embodiments of the invention will now be described, by way of example, with reference to the accompanying drawings in which.

Figure 3A:
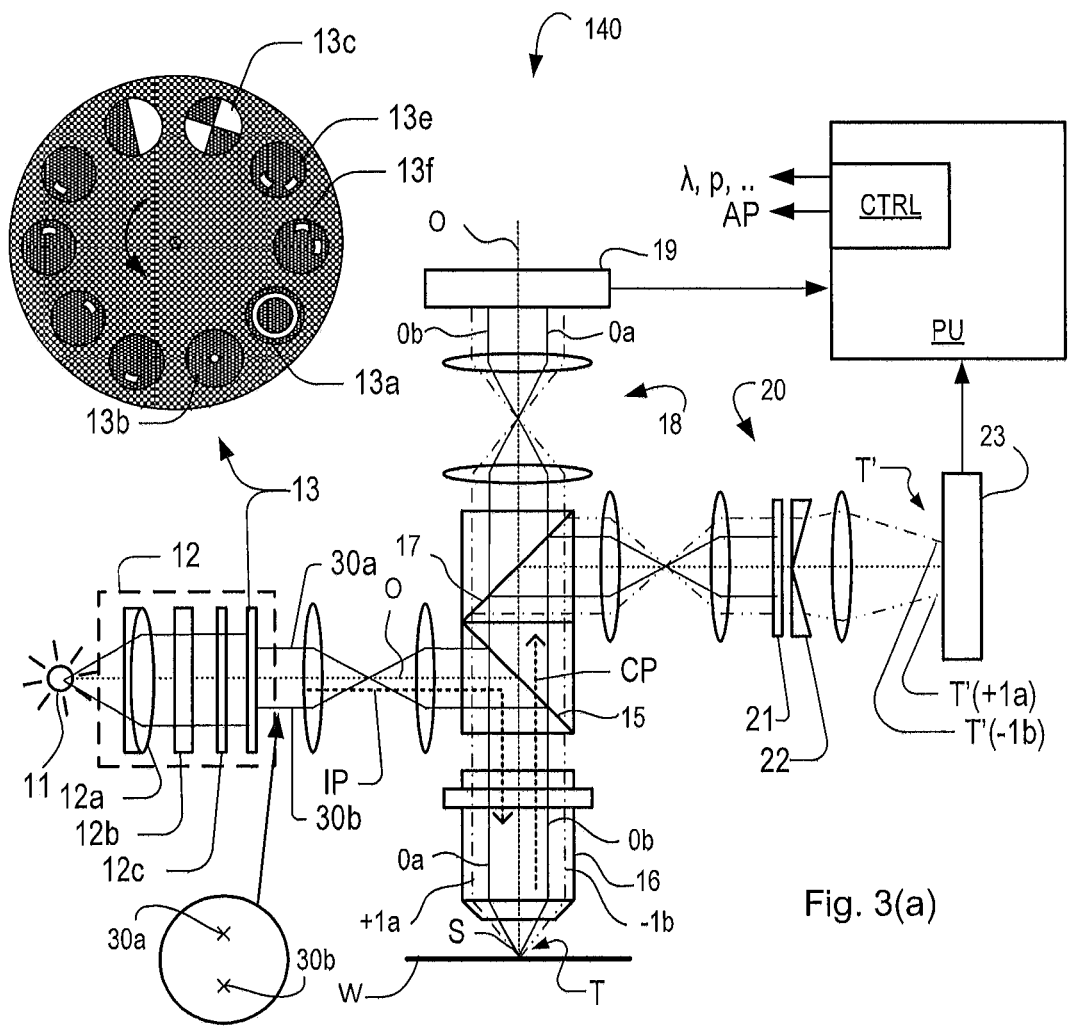
FIG. 3A illustrates schematically an inspection apparatus adapted to perform angle-resolved scatterometry and dark-field imaging inspection methods in accordance with some embodiments of the invention.
Figure 3B:
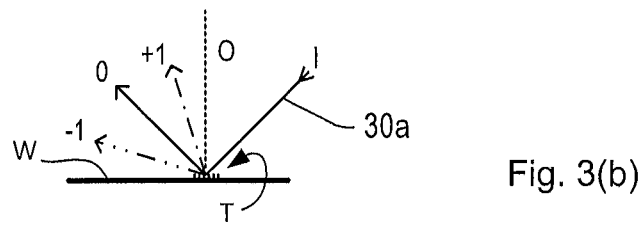
Figure 4A:
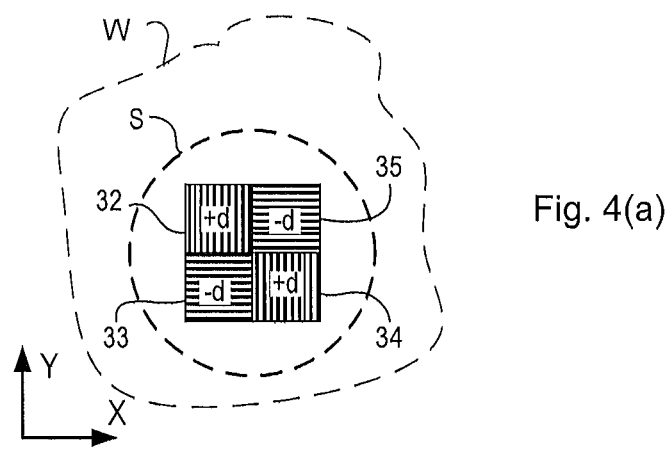
Figure 4B:
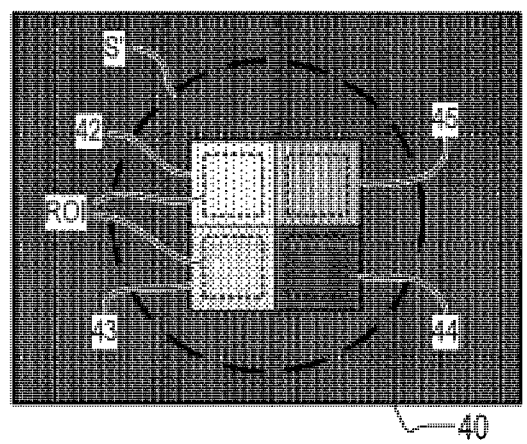
Figure 5:
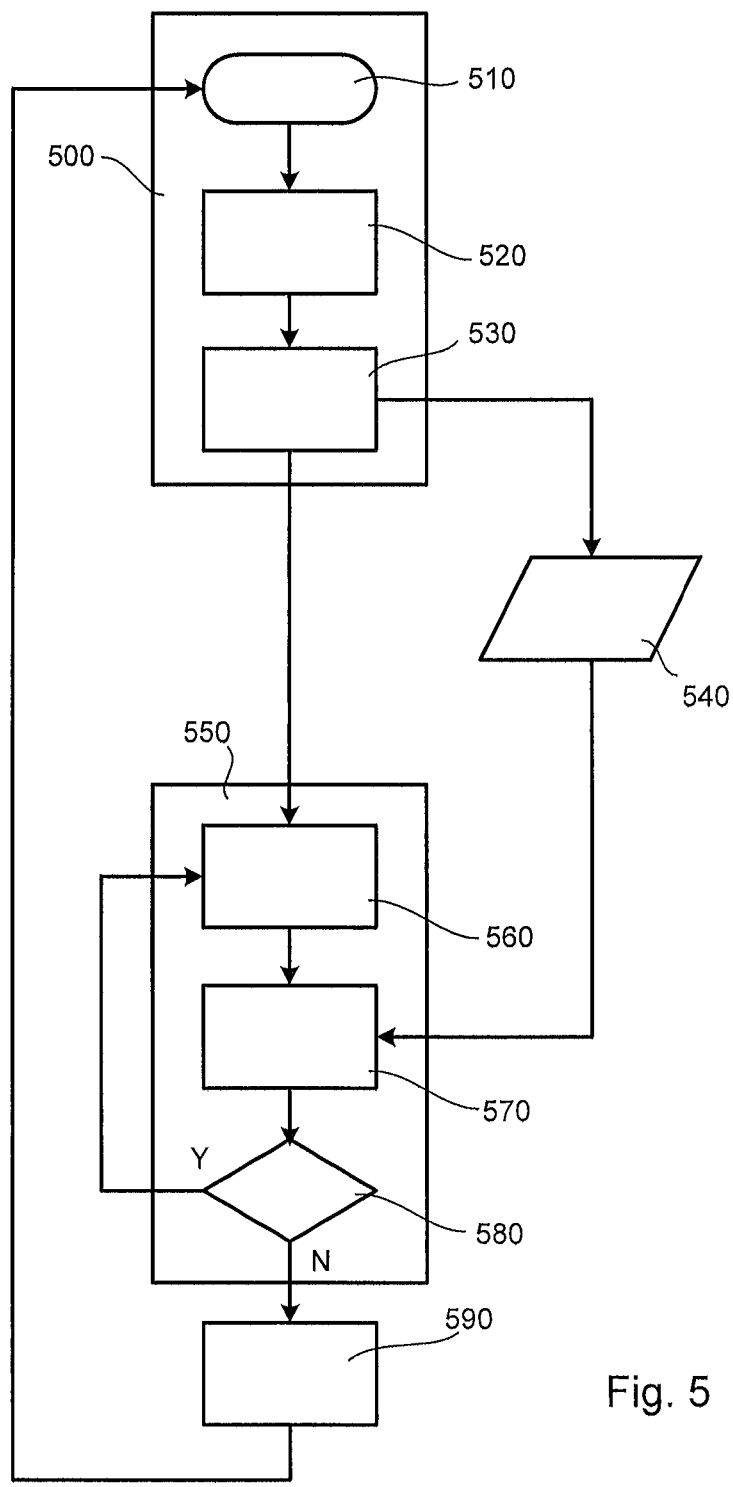
Figure 6:
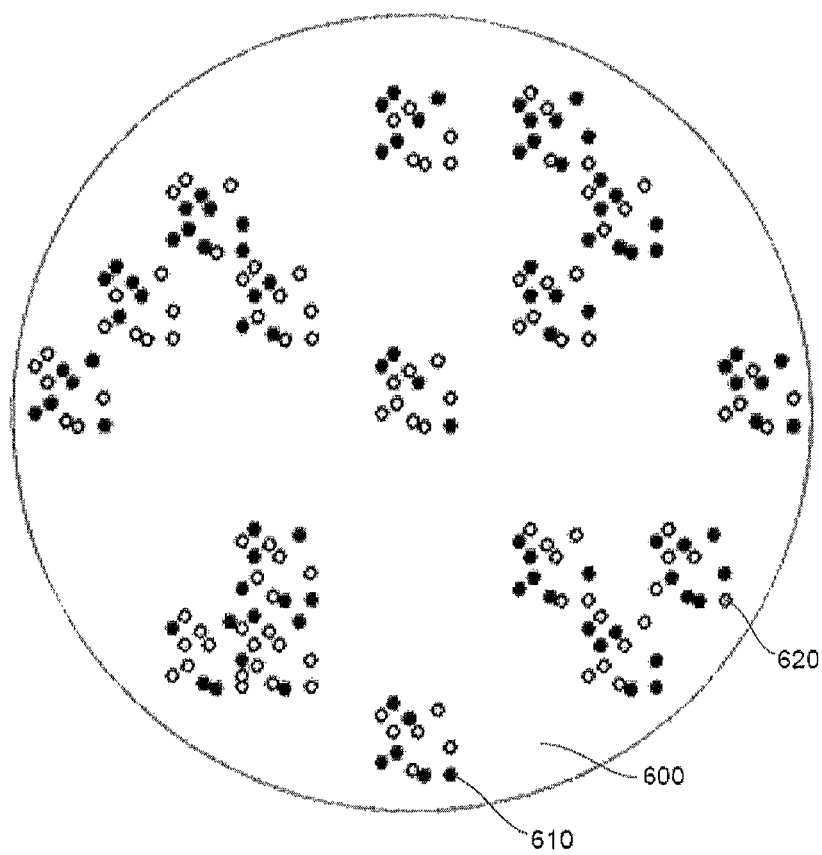

FIG. 3B schematically illustrates an enlarged detail of the diffraction of incident radiation by a target periodic structure in the apparatus of FIG. 3A;

FIG. 4A schematically depicts a form of target and an outline of a measurement spot on a substrate;

FIG. 4B schematically depicts an image of the target of FIG. 4A obtained in the inspection apparatus of FIG. 3;

FIG. 5 is a flowchart depicting a method according to an embodiment of the invention; and FIG. 6 is a schematic representation of the upper surface of a substrate illustrating an exemplary arrangement of targets within a calibration subset.

DETAILED DESCRIPTION

Before describing embodiments of the invention in detail, it is instructive to present an example environment in which embodiments of the present invention may be implemented.

Figure 1:
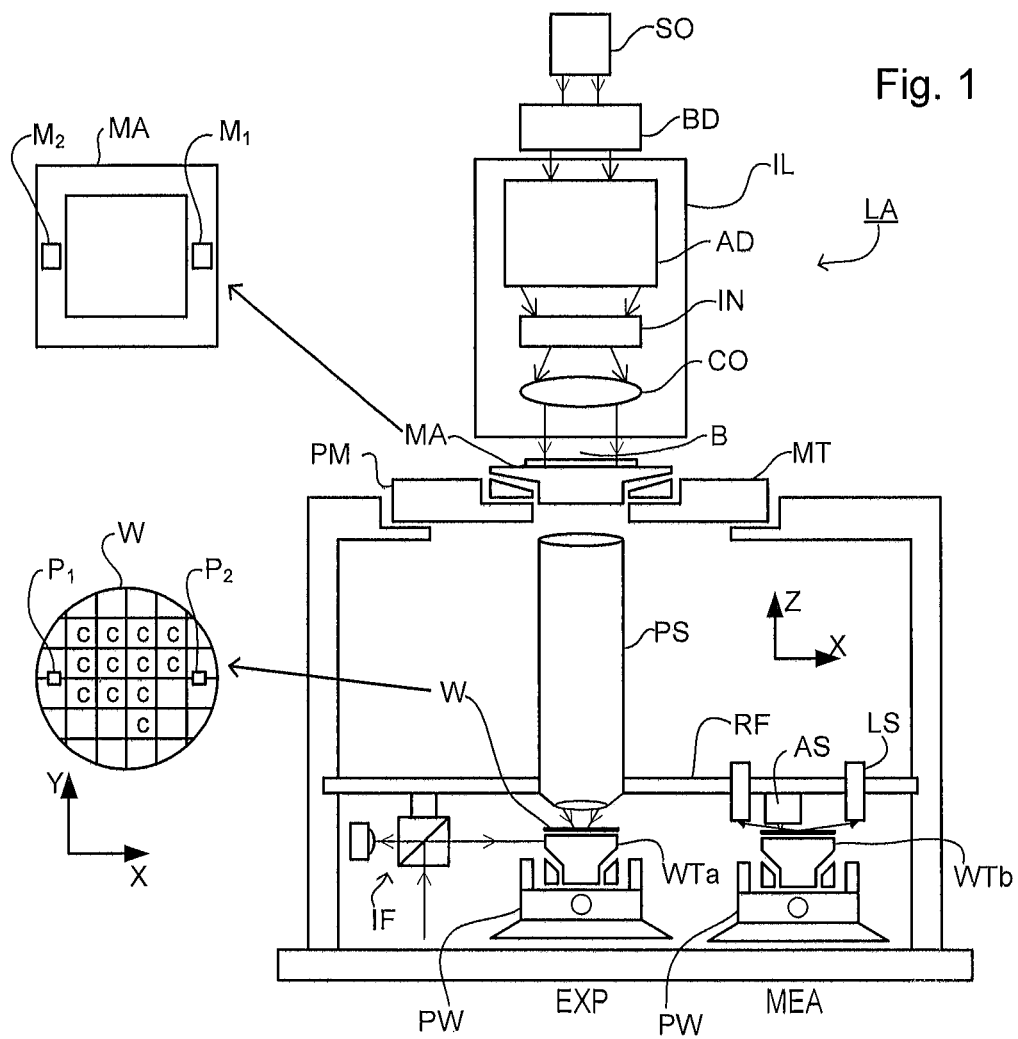
FIG. 1 depicts a lithographic apparatus according to an embodiment of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can take many forms. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
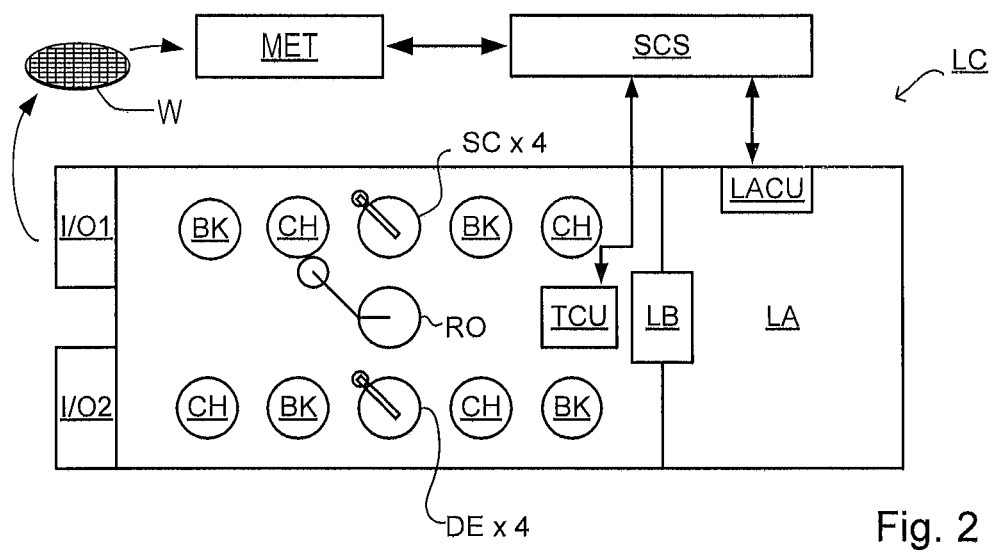
FIG. 2 depicts a lithographic cell or cluster including an inspection apparatus according to an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine a property of the substrates, and in particular, how the values of the property of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Example Inspection Apparatus for Small Target Metrology

FIG. 3A shows schematically elements of an inspection apparatus implementing, e.g., so-called dark field imaging metrology. The apparatus may be a stand-alone device or incorporated in either the lithographic apparatus LA, e.g., at the measurement station, or the lithographic cell LC. An optical axis, which has several branches throughout the apparatus, is represented by a dotted line O. A target periodic structure T and diffracted rays are illustrated in more detail in FIG. 3B.

As described in the prior patent application publications cited in the introduction, the apparatus of FIG. 3A may be part of a multi-purpose angle-resolved scatterometer that may be used instead of, or in addition to, a spectroscopic scatterometer. In this type of inspection apparatus, radiation emitted by a radiation source 11 is conditioned by an illumination system 12. For example, illumination system 12 may include a collimating lens system 12a, a color filter 12b, a polarizer 12c and an aperture device 13. The conditioned radiation follows an illumination path IP, in which it is reflected by partially reflecting surface 15 and focused into a spot S on substrate W via an objective lens 16. A metrology target T may be formed on substrate W. The objective lens 16 may be similar in form to a microscope objective lens, but has, e.g., a high numerical aperture (NA), e.g., at least 0.9 or at least 0.95. Immersion fluid can be used to obtain numerical apertures over 1 if desired.

The objective lens 16 in this example serves also to collect radiation that has been scattered by the target. Schematically, a collection path CP is shown for this returning radiation. The multi-purpose scatterometer may have two or more measurement branches in the collection path. The illustrated example has a pupil imaging branch comprising pupil imaging optical system 18 and pupil image sensor 19. An imaging branch is also shown, which will be described in more detail below. Additionally, further optical systems and branches will be included in a practical apparatus, for example to collect reference radiation for intensity normalization, for coarse imaging of capture targets, for focusing and so forth. Details of these can be found in the prior publications mentioned above.

Where a metrology target T is provided on substrate W, this may be a 1-D periodic structure (e.g., a grating), which is printed such that, after development, the bars are formed of solid resist lines. The target may be a 2-D periodic structure, which is printed such that after development, the periodic structure is formed of solid resist pillars or vias in the resist. The bars, pillars or vias may alternatively be etched into the substrate. Each of these periodic structures is an example of a target structure whose properties may be investigated using the inspection apparatus. In the case of an overlay metrology target, the periodic structure is printed on top of or interleaved with another periodic structure that has been formed by a previous patterning step.

The various components of illumination system 12 can be adjustable to implement different metrology 'recipes' within the same apparatus. In addition to selecting wavelength (color) and polarization as characteristics of the illuminating radiation, illumination system 12 can be adjusted to implement different illumination profiles. The plane of aperture device 13 is conjugate with a pupil plane of objective lens 16 and with the plane of the pupil image detector 19. Therefore, an illumination profile defined by aperture device 13 defines the angular distribution of radiation incident on substrate W in spot S. To implement different illumination profiles, an aperture device 13 can be provided in the illumination path. The aperture device may comprise different apertures 13a, 13b, 13c, etc. mounted on a movable slide or wheel. It may alternatively comprise a fixed or programmable spatial light modulator (SLM). As a further alternative, optical fibers may be disposed at different locations in the illumination pupil plane and used selectively to deliver radiation or not deliver radiation at their respective locations. These variants are all discussed and exemplified in the documents cited above. The aperture device may be of a reflective form, rather than transmissive. For example, a reflective SLM might be used. Indeed, in an inspection apparatus working in the UV or EUV waveband most or all of the optical elements may be reflective.

Depending on the illumination mode, example rays 30a may be provided so that the angle of incidence is as shown at 'I' in FIG. 3B. The path of the zero order ray reflected by target T is labeled '0' (not to be confused with optical axis 'O'). Similarly, in the same illumination mode or in a second illumination mode, rays 30b can be provided, in which case the angles of incidence and reflection will be swapped compared with the first mode. In FIG. 3A, the zero order rays of the first and second example illumination modes are labeled 0a and 0b respectively.

As shown in more detail in FIG. 3B, target periodic structure T as an example of a target structure is placed with substrate W normal to the optical axis O of objective lens 16. In the case of an off-axis illumination profile, a ray 30a of illumination I impinging on periodic structure T from an angle off the axis O gives rise to a zeroth order ray (solid line 0) and two first order rays (dot-chain line +1 and double dot-chain line −1). It should be remembered that with an overfilled small target periodic structure, these rays are just one of many parallel rays covering the area of the substrate including metrology target periodic structure T and other features. Since the beam of illuminating rays 30a has a finite width (necessary to admit a useful quantity of radiation), the incident rays I will in fact occupy a range of angles, and the diffracted rays 0 and +1/−1 will be spread out somewhat. According to the point spread function of a small target, the diffracted radiation of each order +1 and −1 will be further spread over a range of angles, not a single ideal ray as shown.

If the target has multiple periodic components, then each of those will give rise to first and higher diffracted rays, which may be in directions into or out of the page. The example of FIG. 3B is merely describing a one-dimensional grating for simplicity.

In the branch of the collection path for dark-field imaging, imaging optical system 20 forms an image T' of the target on the substrate W on sensor 23 (e.g. a CCD or CMOS sensor). An aperture stop 21 is provided In a plane in the imaging branch of the collection path CP which is conjugate to a pupil plane of objective lens 16. Aperture stop 21 may also be called a pupil stop. Aperture stop 21 can take different forms, just as the illumination aperture can take different forms. The aperture stop 21, in combination with the effective aperture of lens 16, determines what portion of the scattered radiation is used to produce the image on sensor 23. Typically, aperture stop 21 functions to block the zeroth order diffracted beam so that the image of the target formed on sensor 23 is formed only from the first order beam(s). In an example where both first order beams were combined to form an image, this would be the so-called dark field image, equivalent to dark-field microscopy.

The images captured by sensor 23 are output to image processor and controller PU, the function of which will depend on the particular type of measurements being performed. For the present purpose, measurements of asymmetry of the target structure are performed. Asymmetry measurements can be combined with knowledge of the target structures to obtain measurements of performance parameters of lithographic process used to form them. One or more performance parameters that can be measured in this way include for example overlay, focus and/or dose. Special designs of targets are provided to allow these measurements of different performance parameters to be made through the same basic asymmetry measurement method.

Processor and controller PU also generates control signals such as A and AP, for controlling the illumination characteristics (polarization, wavelength) and for selecting the aperture using aperture device 13 or a programmable spatial light modulator. Aperture stop 21 may also be controlled in the same way. Each combination of these parameters of the illumination and the detection is considered a "recipe" for the measurements to be made.

Referring again to FIG. 3B and the illuminating rays 30a, +1 order diffracted rays from the target periodic structure will enter the objective lens 16 and contribute to the image recorded at sensor 23. Rays 30b are incident at an angle opposite to rays 30a, and so the −1 order diffracted rays enter the objective and contribute to the image. Aperture stop 21 blocks the zeroth order radiation when using off-axis illumination. As described in the prior publications, illumination modes can be defined with off-axis illumination in X and Y directions.

Apertures 13c, 13e and 13f in the aperture device 13 of FIG. 3A include off-axis illumination in both X and Y directions, and are of particular interest for the present disclosure. Aperture 13c creates what may be referred to as a segmented illumination profile, and may for example be used in combination with a segmented aperture defined for example by a segmented prism 22, described below. Apertures 13e and 13f may for example be used in combination with an on-axis aperture stop 21, in a manner described in some of the prior mentioned patent application publications.

By comparing images of the target periodic structure under these different illumination modes, asymmetry measurements can be obtained. Alternatively, asymmetry measurements could be obtained by keeping the same illumination mode, but rotating the target. While off-axis illumination is shown, on-axis illumination of the targets may instead be used and a modified, off-axis aperture stop 21 could be used to pass substantially only one first order of diffracted radiation to the sensor. In a further example, a segmented prism 22 is used in combination with an on-axis illumination mode. The segmented prism 22 can be regarded as a combination of individual off-axis prisms, and can be implemented as a set of prisms mounted together, if desired. These prisms define a segmented aperture in which rays in each quadrant are deflected slightly through an angle. This deflection in the pupil plane has the effect of spatially separating the +1 and −1 orders in each direction in the image plane. In other words, the radiation of each diffraction order and direction forms an image to different locations on sensor 23 so that they can be detected and compared without the need for two sequential image capture steps. Effectively, separate images are formed at separated locations on the image sensor 23. In FIG. 3A for example, an image T'(+1a), made using +1 order diffraction from illuminating ray 30a, is spatially separated from an image T'(−1b) made using −1 order diffraction from illuminating ray 30b. This technique is disclosed in the U.S. patent application publication no. US 2011-0102753, the contents of which are hereby incorporated by reference in its entirety. 2nd, 3rd and higher order beams (not shown in FIG. 3) can be used in measurements, instead of, or in addition to, the first order beams. As a further variation, the off-axis illumination mode can be kept constant, while the target itself is rotated 180 degrees beneath objective lens 16 to capture images using the opposite diffraction orders.

Whichever of these techniques is used, the present disclosure applies to methods in which radiation diffracted in two directions, for example the orthogonal directions called X and Y, is simultaneously captured.

While a conventional lens-based imaging system is illustrated, the techniques disclosed herein can be applied equally with plenoptic cameras, and also with so-called "lensless" or "digital" imaging systems. There is therefore a large degree of design choice, which parts of the processing system for the diffracted radiation are implemented in the optical domain and which are implemented in the electronic and software domains.

A measurement of asymmetry A can be calculated from the intensities of detected radiation for the +1 and −1 diffraction orders. In the formula:

$$A = I_{+1} - I_{-1}$$

the asymmetry measurement is calculated as a difference between intensities measured for the +1 and −1 orders. For each intensity measurement I, the subscript denotes the diffraction order +1 or −1.

FIG. 4A depicts a composite target formed on a substrate according to known practice. The composite target comprises four periodic structures 32 to 35 positioned closely together so that they will all be within a measurement spot S formed by the illumination beam of the metrology apparatus and thus are all simultaneously illuminated and simultaneously imaged on detector 23. In an example dedicated to overlay measurement, periodic structures 32 to 35 are themselves composite periodic structures formed by overlying periodic structures that are patterned in different layers of the semiconductor product formed on substrate W. Periodic structures 32 to 35 are differently biased in order to facilitate measurement of overlay between the layers in which the different parts of the composite periodic structures are formed. Also in this example, periodic structures 32 and 34 have periodicity and overlay bias in the X direction, while periodic structures 33 and 35 have orientation and overlay bias in the Y direction. In one example, periodic structures 32 to 35 have biases of +d, −d, +d, −d respectively. Bias +d means that one of the periodic structures has its components arranged so that if they were both printed exactly at their nominal locations one of the components would be offset relative to the other by a distance d. A bias −d means that an overlay periodic structure has its components arranged so that, if perfectly printed, there would be an offset of d but in the opposite direction to the first periodic structure and so on. While four periodic structures are illustrated, a practical embodiment might require a larger matrix to obtain the desired accuracy. For example, a 3×3 array of nine composite periodic structures may have biases −4d, −3d, −2d, −d, 0, +d, +2d, +3d, +4d. Separate images of these periodic structures can be identified in the image captured by detector 23.

FIG. 4B shows an example of an image that may be formed on and detected by the detector 23, using the target of FIG. 4A in the apparatus of FIG. 3A. While the pupil image detector 19 cannot resolve the different individual periodic structures 32 to 35, the field image detector 23 can do so. The dark rectangle labeled 40 represents the field of the image on the detector 23, within which the illuminated spot S on the substrate is imaged into a corresponding circular area S'. Within this, rectangular areas 42-45 represent the images of the small target periodic structures 32 to 35. If the periodic structures are located in product areas, product features may also be visible in this image. Image processor and controller PU processes these images to identify the separate images 42 to 45 of periodic structures 32 to 35. This can be done by pattern matching techniques, so that the images do not have to be aligned very precisely at a specific location within the sensor frame. Reducing the need for accurate alignment in this way greatly improves throughput of the measuring apparatus as a whole. However, positional variation may introduce inaccuracies in the measurement results, if the imaging process is subject to non-uniformities across the image field. Not only properties of the various components in the optical path, but also intensity of illumination and sensitivity of detection can vary across the image field. In United States patent application publication no. US 2012-0242970, corrections are made in the measured intensities, according to the position at which each periodic structure image is observed within the field of image detector 23. Such corrections can be applied in the techniques of the present disclosure as well.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance, which can be measured by measuring asymmetry of a periodic structure target, is an example of such a parameter.

Different targets can be designed so that their asymmetry depends strongly on a parameter of interest for measurement of the lithographic process. For the examples described herein it is assumed that target is designed for measurement of overlay as a parameter of interest. A measurement of overlay OV in the vicinity of this target can be calculated as a function of the asymmetries measured for two or more periodic structures, using knowledge of the different bias values they contain. That is to say, the unknown overlay OV can be calculated using measurements of asymmetry of biased periodic structures, combined with knowledge of the different biases in the periodic structures. Noting that the example target of FIG. 4A is a composite target with component periodic structures in X and Y directions, and having two bias values +d and −d, it will be understood that the target allows measurements of overlay in both X and Y directions to be calculated from measurements of asymmetry of those target periodic structures. In one example, overlay is calculated by the formula:

$$OV = \frac{p}{2\pi} \cdot \operatorname{atan}\left(\tan\left(\frac{2\pi d}{p}\right) \cdot \frac{A_{+d} + A_{-d}}{A_{+d} - A_{-d}}\right),$$

where d is the amount of bias and p is the periodic structure pitch. Bias and pitch may be expressed for example in nanometers (nm).

Sensor Asymmetry Correction

Asymmetry in the sensor optics can result in a contribution to asymmetry measurements, which has nothing to do with characteristics of the target being measured. To address this, a calibration may be performed. The calibration may comprise performing first calibration measurements using a first illumination mode equivalent to measuring of a target at 0 degrees rotation. Conversely, second calibration measurements may be made using a second illumination mode equivalent to measuring of a target at 180(π) degrees rotation.

As a result of the first and second calibration measurements, four intensity values may be obtained, comprising:
- an intensity $I_{+1}^0$ representing the +1 order diffracted radiation for the target at 0 degrees rotation;
- an intensity $I_{-1}^\pi$ representing the −1 order diffracted radiation for the target at 180 degrees rotation;
- an intensity $I_{-1}^0$ representing the −1 order diffracted radiation for the target at 0 degrees rotation; and
- an intensity $I_{+1}^\pi$ representing the +1 order diffracted radiation of the target at 180 degrees rotation.

For each illumination mode, from these intensity values, a nominal asymmetry can be calculated as already described. If there were no asymmetry in the optical system, then these asymmetry values ought to be identical. However, in a real apparatus, asymmetries arise, which should be designed out of the measurement, or somehow corrected to achieve maximum of asymmetry of the target itself. As such, a sensor asymmetry correction value E can be calculated by:

$$\varepsilon = 0.5(\varepsilon_{+d} + \varepsilon_{-d}),$$

$$\varepsilon_{+d} = \frac{I_{+1}^0|_{+d} + I_{+1}^\pi|_{+d} - (I_{-1}^0|_{+d} + I_{-1}^\pi|_{+d})}{I_{+1}^0|_{+d} + I_{+1}^\pi|_{+d} + I_{-1}^0|_{+d} + I_{-1}^\pi|_{+d}}$$

$$\varepsilon_{-d} = \frac{I_{+1}^0|_{-d} + I_{+1}^\pi|_{-d} - (I_{-1}^0|_{-d} + I_{-1}^\pi|_{-d})}{I_{+1}^0|_{-d} + I_{+1}^\pi|_{-d} + I_{-1}^0|_{-d} + I_{-1}^\pi|_{-d}}$$

where the +d, −d subscript relates to the bias of the target being measured.

This sensor asymmetry correction value E can then be used to correct on-product sensor asymmetries between the 0 and 180 degree measurements, as follows:

$$I_{+1,corr} = \frac{I_{+1}}{(1+\varepsilon)}$$

$$I_{-1,corr} = \frac{I_{-1}}{(1-\varepsilon)}$$

This sensor asymmetry correction concept has been further extended by making the assumption that this sensor asymmetry depends on both the sensor and its interaction with the product, and therefore the sensor asymmetry is position dependent. To account for this, a small subset of the desired targets is measured during a calibration step. Then, based on this data, a statistical model for determining position-dependent sensor asymmetry correction $\hat{\epsilon}$ for subsequent measured intensities is constructed. Using the corrections, measurements may be made at only a single orientation and the statistical model may then be used to obtain sensor asymmetry corrected overlay measurements. This eliminates the need to perform a full set of measurements (at 0 and 180 degrees) per target to compensate for the sensor asymmetry. The position-dependent sensor asymmetry correction t may be calculated as follows and used in place of $\epsilon$ to determine corrected intensities $I_{+1,corr}$, $I_{-1,corr}$:

$$\hat{\epsilon} = (\text{Data} - \overline{\text{Data}} - \overline{\text{Data}}_{Intrafield}) \frac{b}{a} + \overline{\epsilon} + \overline{\epsilon}_{Intrafield}$$

where $(a,b) = \mathcal{F}(\epsilon', \text{Data}')$ — $\mathcal{F}$ being a function such as a canonical correlation, $\epsilon'$ is a zero-mean version of the measured $\epsilon$, Data is a column zero-mean version of measured data (e.g., from the intensity measurements), $\overline{\epsilon}$ is the substrate average of $\epsilon$, $\overline{\epsilon}_{Intrafield}$ is the intrafield average of $\epsilon$, $\overline{\text{Data}}$ is the substrate average of Data, and $\overline{\text{Data}}_{Intrafield}$ is the intrafield average of Data. Intrafield average in this context is the average of measurements within the relevant field on the substrate.

Illumination Acquisition Setting Calibration

Measurement accuracy (e.g., of overlay or other parameter of interest) can be further improved by measurement of the target at multiple different illumination acquisition settings (e.g., wavelengths). However measurement using multiple illumination acquisition settings decreases throughput. It is therefore proposed to perform an illumination acquisition setting calibration step similar to the sensor asymmetry calibration step already described. In a similar way to how the sensor asymmetry calibration step determines a position-dependent correction to correct for differences between illumination modes, the method now proposed determines a position-dependent correction to correct for differences between illumination acquisitions settings of the measurement radiation. This will enable the possibility to measure a target using only e.g., a single wavelength, and determining a position-dependent correction or compensation to obtain estimates of target measurements using one or more different wavelengths.

FIG. 5 is a flowchart describing a method according to an embodiment. The method starts with a calibration phase 500. At step 510 a first substrate of a lot is loaded. At sampling and measurement step 520, all, or desirably a subset, of the targets on the first substrate are measured with two or more different illumination acquisition settings. The different illumination acquisition settings in this context may comprise different wavelengths, different polarizations, different incident radiation angles, or different combinations of two or more selected from: wavelength, polarization or angle. At model determination step 530, a position-dependent statistical correction model 540 is determined from the measurements performed at step 520. The output of the calibration phase 500 is a statistical correction model 540 for illumination acquisition setting correction.

The method proceeds to a subsequent correction phase 550, where one or more subsequent substrates in the lot are measured. The method proceeds to measurement step 560 during which a further (e.g., a next scheduled) substrate in the lot is loaded and a full substrate measurement is performed (all intended targets of a measurement set). In this step 560, the target measurements are performed under only a single illumination acquisition setting (e.g., a single wavelength, single polarization or single wavelength, polarization and/or angle combination). At estimation step 570, a position dependent illumination acquisition setting correction is estimated using the measurement data from step 560 and the position-dependent statistical correction model 540. In this way, the measurements obtained at step 560 are "color corrected" using the position dependent statistical correction model 540 to obtain estimates of the target measurements under different illumination acquisition settings. At step 580, it is determined whether more substrates of the lot are to be measured: if yes, the method returns to step 560; if no a new lot is started 590 and the method returns to step 510.

Note that many aspects of the method depicted in FIG. 5 are purely exemplary. For example, the statistical correction model does not necessarily need to be calculated and applied on a per-lot basis. For example, a calibration stage may be performed (and therefore correction model determined) less frequently than this, e.g., per run or per day. Additionally, while the methods above have been described in relation to dark-field metrology, e.g., using dark-field imaging branch of the apparatus depicted in FIG. 3A, they are not so limited. For example, the methods are equally applicable to pupil-plane measurements (angle-resolved metrology), for example as performed using the pupil imaging branch of the apparatus depicted in FIG. 3A.

More detail of the sampling and measurement step 520, correction determination step 530 and estimation step 570 will now be described.

FIG. 6 illustrates an exemplary sampling plan for the sampling and measurement step 520 of the calibration phase 500. This sampling and measurement step 520 comprises measuring a calibration subset (filled circles) 610 of the measurement sampling scheme 610, 620 (measurement set), where unfilled circles 620 indicate targets of the measurement sampling scheme not included in the calibration subset 610. The calibration subset 610 may comprise a few, sparsely distributed targets over a substrate 600. Calibration subset 610 may comprise, for example, between 20 and 200 targets, between 50 and 150 targets or more specifically in the region of about 100 targets. In an embodiment, the targets of calibration subset 610 are distributed over the intrafield locations (i.e., locations within a field, the locations of targets being repeated for each field) to reflect the number of occurrences in the sampling scheme. The specific targets corresponding to a particular intrafield location may be randomly selected. It is proposed that different calibration models are determined for different sampling schemes and target designs.

During the statistical correction model determination step 530 of calibration phase 500, a model $\mathcal{M}$, intrafield averages and a substrate average are calculated from the measurements of the targets comprised in the calibration subset 610. The model $\mathcal{M}$ may take the form of:

$$\mathcal{M} = \mathcal{F}_{(\text{Data}'_{\lambda_1}, \text{Data}'_{\lambda_1, \ldots, \lambda_n})}$$

where $\mathcal{F}$ is a function (e.g., a canonical correlation) which relates the inputs to model $\mathcal{M}$. In a specific embodiment, the inputs may comprise, for measurements at n wavelengths $\lambda_1, \ldots, \lambda_n$ (or n acquisition illumination settings):

[$\text{Data}'_{\lambda_1}$]=(k,4), column zero-mean version of measured $\text{Data}_{\lambda_1}$.

[$\text{Data}'_{\lambda_2, \ldots, \lambda_n}$]=(k,m), column zero-mean version of measured $\text{Data}_2$.

k: number of targets measured.

m: number of model parameters:
Measured intensities for $\lambda_2, \ldots, \lambda_n$
Polynomials of (x,y) target coordinates on the substrate.
and where:

$$Data'_{\lambda_i} := \left(Data_{\lambda_i} - \overline{Data_{\lambda_1}} - \overline{Data_{\lambda_1}}_{Intrafield}\right)$$

where $\overline{Data_{\lambda_1}}$ is the substrate average and $$\overline{Data_{\lambda_1}}_{Intrafield}$$

comprises the intrafield averages.

The actual inputs for the $Data_{\lambda_1}$ matrices may each comprise any suitable intensity metric following measurement of each target of the calibration subset 610 and a position metric describing the position of each of these targets. In a specific example, the $Data_{\lambda_1}$ matrix may comprise:
Intensities
  $Data_{\lambda_1}(:,1) := I_{+1}^{+d}$, positive bias normal intensity,
  $Data_{\lambda_1}(:,2) := I_{-1}^{+d}$, positive bias complementary intensity,
  $Data_{\lambda_1}(:,3) := I_{+}^{-d}$, negative bias normal intensity,
  $Data_{\lambda_1}(:,4) := I_{-1}^{-d}$, negative bias complementary intensity.
Target Position
  $Data_{\lambda_1}(:,5) :=$ Target position X [m],
  $Data_{\lambda_1}(:,6) :=$ Target position Y [m],
  $Data_{\lambda_1}(:,7) :=$ Target position $X^2$ [m],
  $Data_{\lambda_1}(:,8) :=$ Target position $Y^2$ [m], etc.
$Data_{\lambda_2,\ldots,\lambda_n}$ matrices may be constructed as $Data_{\lambda_1}$, but replacing the intensities for Ax by a concatenation of the intensities for $\lambda_2, \ldots, \lambda_n$; target positions are only included once.

Following this, the correction phase 550 may comprise measuring $Data_{\lambda_1}$ for all points in the recipe (step 560) and then performing estimation step 570, in which equivalent measurement data for the other wavelengths $\widetilde{Data'}_{\lambda_2,\ldots,\lambda_n}$ may be estimated as:

$$\widetilde{Data'}_{\lambda_2,\ldots,\lambda_n} = \mathcal{M}\left(Data'_{\lambda_1} - \overline{Data'_{\lambda_1}} - \overline{Data'_{\lambda_1}}_{Intrafield}\right) + \overline{Data'_{\lambda_2,\ldots,\lambda_n}} + \overline{Data'_{\lambda_2,\ldots,\lambda_n}}_{Intrafield}$$

where $\mathcal{M}$, $\overline{Data'_{\lambda_1}}$, $\overline{Data'_{\lambda_1}}_{Intrafield}$, $\overline{Data'_{\lambda_2,\ldots,\lambda_n}}$ and $\overline{Data'_{\lambda_2,\ldots,\lambda_n}}_{Intrafield}$ are all outputs of the calibration phase.

Following this, overlay (or other parameter of interest, e.g., focus) can be calculated using the measured intensities for $\lambda_1$ and the estimated intensities for $\lambda_2, \ldots, \lambda_n$.

While specific embodiments of the invention have been described above, it will be appreciated that the invention may be practiced otherwise than as described.

While overlay periodic structures are a common example, other parameters of the lithographic process can also be measured, by designing targets whose asymmetry depends on those other performance parameters, rather than overlay. In this regard, it has previously been disclosed that targets can be designed for which asymmetry of a periodic structure is sensitive to variations in focus during an exposure step of the lithographic process. Knowing the relationship between focus and asymmetry, in particularly by using periodic structures with different bias values for their sensitivity, focus measurements can be derived by observing asymmetry in targets of this type. Similarly, targets can be devised in which asymmetry is sensitive to the dose variations in the lithographic process. Using such targets, dose variations across the substrate or between substrates can be measured based on measurements of asymmetry of the type already described. All these different types of targets can be provided on the same substrate, if desired, to provide comprehensive information on the performance of the lithographic process. Using the image-based diffraction based measurement systems described herein, very compact targets can be provided, so that such measurements do not unduly impact the space available for functional product features on the same substrate.

The calculation of corrections above may be applied at the stage of calculating asymmetry, or before combining asymmetry values to calculate a parameter of interest such as overlay. The techniques described above can be performed to calibrate and then correct the asymmetry measurements for different wavelengths and/or polarization of radiation (or incident angles).

While the inspection apparatus or tool illustrated in the embodiments comprises a particular form of scatterometer having first and second branches for simultaneous imaging of pupil plane and substrate plane by parallel image sensors, alternative arrangements are possible. Rather than provide two branches permanently coupled to objective lens 16 with beam splitter 17, the branches could be coupled selectively by a movable optical element such as a mirror. The optical system could be made having a single image sensor, the optical path to the sensor being reconfigured by a movable element to serve as a pupil plane image sensor and then a substrate plane image sensor.

While the target structures described above are metrology targets specifically designed and formed for the purposes of measurement, in other embodiments, a property may be measured on targets which are functional parts of devices formed on the substrate. Many devices have regular, grating-like structures. The terms 'target grating', 'target periodic structure' and 'target structure' as used herein do not require that the structure has been provided specifically for the measurement being performed.

In association with the inspection apparatus hardware and suitable periodic structures of the targets as realized on substrates and patterning devices, an embodiment may include a computer program containing one or more sequences of machine-readable instructions implementing methods of measurement and/or calculation of the type illustrated above to obtain information about a lithographic process. This computer program may be executed for example within controller PU in the apparatus of FIG. 3 and/or the control unit LACU of FIG. 2. There may also be provided a data storage medium (e.g., semiconductor memory, magnetic or optical disk) having such a computer program stored therein.

Further embodiments according to the invention are described in below numbered clauses:

1. A method of measuring a parameter of interest relating to a structure formed by a process on a substrate, the method comprising:
  a) measuring the structure with measurement radiation comprising a first illumination acquisition setting to obtain a first measurement value for the structure corresponding to measurement of the structure with the first illumination acquisition setting, wherein the illumination acquisition setting determines one or more selected from: a wavelength, a polarization or an incident angle of the measurement radiation; and b) estimating, by applying a correction model to the first measurement value, at least a second measurement value for the structure corresponding to measurement of the structure with a second illumination acquisition setting different from the first illumination acquisition setting.

2. The method of clause 1, wherein the correction model comprises a position-dependent correction model dependent on the position of the structure on the substrate.

3. The method of clause 1 or clause 2, comprising a calibration phase for determining the correction model.

4. The method of clause 3, wherein the correction model comprises a statistical correlation model relating measurements of the structure using the first illumination acquisition setting to measurements of the structure using the second illumination acquisition setting.

5. The method of clause 3 or clause 4, wherein the calibration phase comprises measuring a calibration set of structures on the substrate with at least measurement radiation comprising the first illumination acquisition setting and with at least measurement radiation comprising the second illumination acquisition setting.

6. The method of clause 5, wherein the calibration phase comprises:

measuring the calibration set of structures on the substrate with measurement radiation comprising one or more further illumination acquisition settings, additional to the first illumination acquisition setting and second illumination acquisition setting, wherein the correction model comprises a statistical correlation model relating measurements of the structure using the first illumination acquisition setting to measurements of the structure using the second illumination acquisition setting and to each of the further illumination acquisition settings, and wherein the estimating further comprising estimating, by applying the correction model to the first measurement value, a further measurement value for the structure corresponding to each further illumination acquisition setting.

7. The method of clause 5 or clause 6, wherein steps a) and b) are performed for each structure of a measurement set of structures on the substrate, and wherein the calibration set of structures is a subset of the measurement set of structures.

8. The method of clause 7, wherein the structures of the calibration set are distributed over intrafield locations of the measurement set.

9. The method of clause 8, wherein the specific structures included in the calibration set corresponding to a particular intrafield location are randomly selected.

10. The method of any of clauses 3 to 9, wherein the calibration phase is performed on a first substrate of a lot and steps a) and b) are performed for one or more of the remaining substrates of the lot.

11. The method of any of clauses 3 to 10, wherein the calibration phase comprises determining a function which relates first measurement data corresponding to the first illumination acquisition setting to at least second measurement data corresponding to the second illumination acquisition setting.

12. The method of clause 11, wherein the function comprises determining a canonical correlation between the first measurement data and second measurement data.

13. The method of clause 11 or clause 12, wherein the first measurement data and second measurement data each comprise, for each structure measured in the calibration phase, at least one intensity metric related to the intensity of a selected part of diffracted radiation following diffraction by the structure being measured, and a position metric relating to the position of the structure on the substrate.

14. The method of any preceding clause, wherein the parameter of interest is related to asymmetry in the structure, and step a) comprises:

forming and detecting a first image of the structure while illuminating the structure with the measurement radiation, the first image being formed using a first selected part of diffracted radiation;

forming and detecting a second image of the structure while illuminating the structure with the measurement radiation, the second image being formed using a second selected part of diffracted radiation which is symmetrically opposite to the first part, in a diffraction spectrum of the structure; and calculating a measurement of asymmetry in the structure based on intensity values derived from the detected first and second images.

15. The method of any of clauses 1 to 13, wherein the measuring the structure is performed as a pupil plane measurement.

16. The method of any preceding clause, wherein the parameter of interest is overlay.

17. The method of any of clauses 1 to 15, wherein the parameter of interest is focus or dose.

18. An inspection apparatus configured to measure a parameter of interest relating to a structure formed by a process on a substrate, the inspection apparatus being configured to perform the method of any preceding clause.

19. The inspection apparatus of clause 18, comprising:

an illumination and detection arrangement operable in a first illumination acquisition setting to perform step a); and a controller programmed to perform step b).

20. A computer program product comprising machine readable instructions for causing a programmable processing device to implement the method of any of clauses 1 to 17.

21. A lithographic system comprising:

a lithographic apparatus comprising:

an illumination optical system arranged to illuminate a pattern;

a projection optical system arranged to project an image of the pattern onto a substrate; and an inspection apparatus of clause 18 or clause 19, wherein the lithographic apparatus is arranged to use the results from the inspection apparatus, including the correction, in applying the pattern to further substrates.

22. A method of manufacturing devices wherein a device pattern is applied to a series of substrates using a lithographic process, the method including inspecting at least one periodic structure formed as part of or beside the device pattern on at least one of the substrates using an inspection method of any of clauses 1 to 17, and controlling the lithographic process for later substrates in accordance with a result of the inspection method.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicant has grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of measuring a parameter of interest relating to a structure formed by a process on a substrate, the method comprising:
   measuring the structure with measurement radiation comprising a first illumination acquisition setting to obtain a first measurement value for the structure corresponding to measurement of the structure with the first illumination acquisition setting, wherein the illumination acquisition setting determines one or more selected from: a wavelength, a polarization or an incident angle of the measurement radiation; and
   estimating, by applying a correction model to the first measurement value, at least a second measurement value for the structure corresponding to measurement of the structure with a second illumination acquisition setting different from the first illumination acquisition setting.

2. The method of claim 1, wherein the correction model comprises a position-dependent correction model dependent on the position of the structure on the substrate.

3. The method of claim 1, comprising a calibration phase for determining the correction model.

4. The method of claim 1, wherein the correction model comprises a statistical correlation model relating measurements of the structure using the first illumination acquisition setting to measurements of the structure using the second illumination acquisition setting.

5. The method of claim 3, wherein the calibration phase comprises measuring a calibration set of structures on the substrate with, at least measurement radiation comprising the first illumination acquisition setting and with at least measurement radiation comprising the second illumination acquisition setting.

6. The method of claim 5, wherein the calibration phase comprises:
   measuring the calibration set of structures on the substrate with measurement radiation comprising one or more further illumination acquisition settings, additional to the first illumination acquisition setting and second illumination acquisition setting,
   wherein the correction model comprises a statistical correlation model relating measurements of the structure using the first illumination acquisition setting to measurements of the structure using the second illumination acquisition setting and to each of the one or more further illumination acquisition settings, and
   wherein the estimating further comprises comprising estimating, by applying the correction model to the first measurement value, a further measurement value for the structure corresponding to each further illumination acquisition setting.

7. The method of claim 5, wherein the measuring and estimating are performed for each structure of a measurement set of structures on the substrate, and wherein the calibration set of structures is a subset of the measurement set of structures.

8. The method of claim 7, wherein the structures of the calibration set are distributed over intrafield locations of the measurement set.

9. The method of claim 8, wherein the specific structures included in the calibration set corresponding to a particular intrafield location are randomly selected.

10. The method of claim 3, wherein the calibration phase is performed on a first substrate of a lot and the measuring and estimating are performed for one or more of the remaining substrates of the lot.

11. The method of claim 3, wherein the calibration phase comprises determining a function which relates first measurement data corresponding to the first illumination acquisition setting to at least second measurement data corresponding to the second illumination acquisition setting.

12. The method of claim 11, wherein the function comprises determining a canonical correlation between the first measurement data and second measurement data.

13. The method of claim 11, wherein the first measurement data and second measurement data each comprise, for each structure measured in the calibration phase, at least one intensity metric related to the intensity of a selected part of diffracted radiation following diffraction by the structure being measured, and a position metric relating to the position of the structure on the substrate.

14. The method of claim 1, wherein the parameter of interest is related to asymmetry in the structure, and the measuring comprises:
   forming and detecting a first image of the structure while illuminating the structure with the measurement radiation, the first image being formed using a first selected part of diffracted radiation;
   forming and detecting a second image of the structure while illuminating the structure with the measurement radiation, the second image being formed using a second selected part of diffracted radiation which is symmetrically opposite to the first part, in a diffraction spectrum of the structure; and
   calculating a measurement of asymmetry in the structure based on intensity values derived from the detected first and second images.

15. The method of claim 1, wherein the parameter of interest is overlay or focus or dose.

16. An inspection apparatus configured to measure a parameter of interest relating to a structure formed by a process on a substrate, the inspection apparatus being configured to perform the method of claim 1.

17. The inspection apparatus of claim 16, comprising:
an illumination and detection arrangement operable in a first illumination acquisition setting to perform the measuring; and
a controller programmed to perform the estimating.

18. A method of manufacturing devices wherein a device pattern is applied to a series of substrates using a lithographic process, the method including inspecting at least one periodic structure formed as part of or beside the device pattern on at least one of the substrates using the inspection method of claim 1, and controlling the lithographic process for later substrates in accordance with a result of the inspection method.

19. A non-transitory computer program product comprising machine readable instructions therein, the instructions, upon execution by a programmable processing device, configured to cause the programmable processing device to at least:
obtain measurements of a structure formed by a process on a substrate with measurement radiation comprising a first illumination acquisition setting to obtain a first measurement value for the structure corresponding to measurement of the structure with the first illumination acquisition setting, wherein the illumination acquisition setting determines one or more selected from: a wavelength, a polarization or an incident angle of the measurement radiation; and
estimate, by application of a correction model to the first measurement value, at least a second measurement value for the structure corresponding to measurement of the structure with a second illumination acquisition setting different from the first illumination acquisition setting.

20. A lithographic system comprising:
a lithographic apparatus comprising:
an illumination optical system arranged to illuminate a pattern;
a projection optical system arranged to project an image of the pattern onto a substrate; and
the non-transitory computer program product of claim 19, wherein the lithographic apparatus is arranged to use the results from the non-transitory computer program product in applying the pattern to further substrates.

* * * * *